United States Patent [19]
Hollander et al.

[11] Patent Number: 5,030,614
[45] Date of Patent: Jul. 9, 1991

[54] SUPERCONDUCTOR SENSORS

[75] Inventors: Milton B. Hollander; William E. McKinley, both of Stamford, Conn.

[73] Assignee: Omega Engineering, Inc., Stamford, Conn.

[21] Appl. No.: 402,672

[22] Filed: Sep. 5, 1989

Related U.S. Application Data

[63] Continuation-in-part of Ser. No. 104,136, May 15, 1987, abandoned.

[51] Int. Cl.$^5$ .................. C04B 35/00; G01R 33/02
[52] U.S. Cl. ........................... 505/1; 324/248; 324/71.6; 505/727; 505/704; 505/725
[58] Field of Search ............ 324/512, 71.6, 203, 324/204, 248; 505/843, 847, 727, 704, 725; 374/176, 183, 184; 361/19

[56] References Cited

U.S. PATENT DOCUMENTS

| 3,325,888 | 6/1967 | Weinig et al. | |
| 3,579,035 | 5/1971 | Burnier | 361/19 |
| 3,918,998 | 11/1975 | Marancik et al. | 148/11.8 R |
| 4,242,536 | 12/1980 | Young | 174/128 S |
| 4,869,598 | 9/1989 | McDonald | 307/306 |

FOREIGN PATENT DOCUMENTS

| 830149 | 3/1981 | U.S.S.R. | 374/176 |
| 936203 | 6/1982 | U.S.S.R. | 361/19 |
| 1128972 | 10/1968 | United Kingdom | 324/248 |

Primary Examiner—Kenneth Wieder
Assistant Examiner—Maura K. Regan
Attorney, Agent, or Firm—Bruce E. Hosmer

[57] ABSTRACT

A superconducting wire is produced by the surrounding of a superconductive material core with an intermediate compressible insulating layer and an outer malleable layer and then drawing said composite structure through a series of dies to reduce the diameter of the wire on the order of 400 to 10,000 times or by reducing the superconductive core material to the desired wire size by passing it through a series of dies to reduce the diameter of the wire on the order of 400 to 10,000 times and then coating the wire with a noncompressible insulating layer and then placing an outer malleable layer over the insulated wire and drawing this through dies to snuggly fit the outer layer onto the insulated wire. This wire's superconducting characteristics are not intended for carrying high levels of currents so the reduction of the available current carrying cross section by the introduction of the insulating layer is not of concern in the applications for the wire. Low and high temperature high level current-carrying superconductors lose their superconductivity with changes in their critical temperature and critical magnetic field. A loss in superconductivity in a high current-carrying superconductor can cause irreparable damage to the superconductor and its physical environment. Said superconducting wire when used in assembly with a high current-carrying superconductor provides a means for detecting changes in the critical temperature and critical magnetic field of the current-carrying superconductor before the superconducting properties are lost so that measures can be taken to correct the changes in the critical temperature and the critical magnetic field.

16 Claims, 2 Drawing Sheets

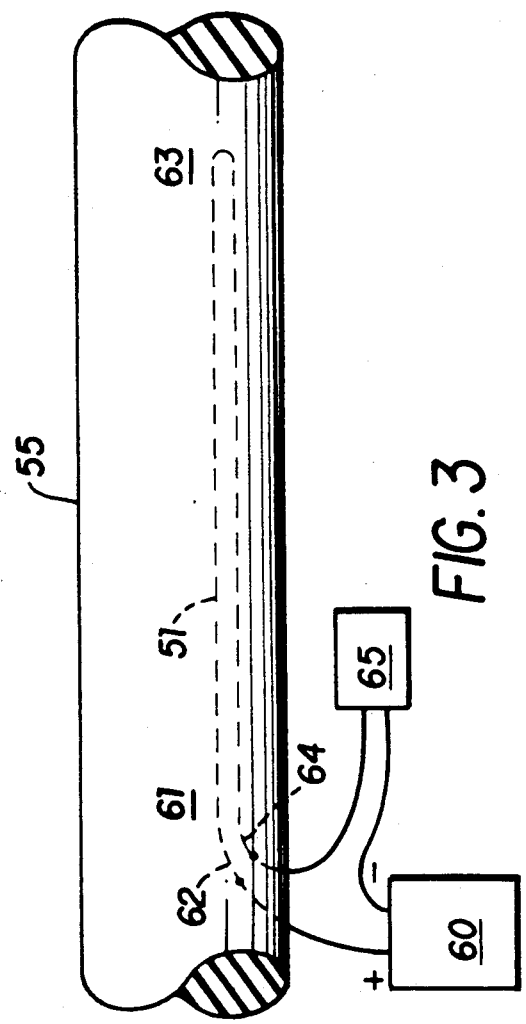
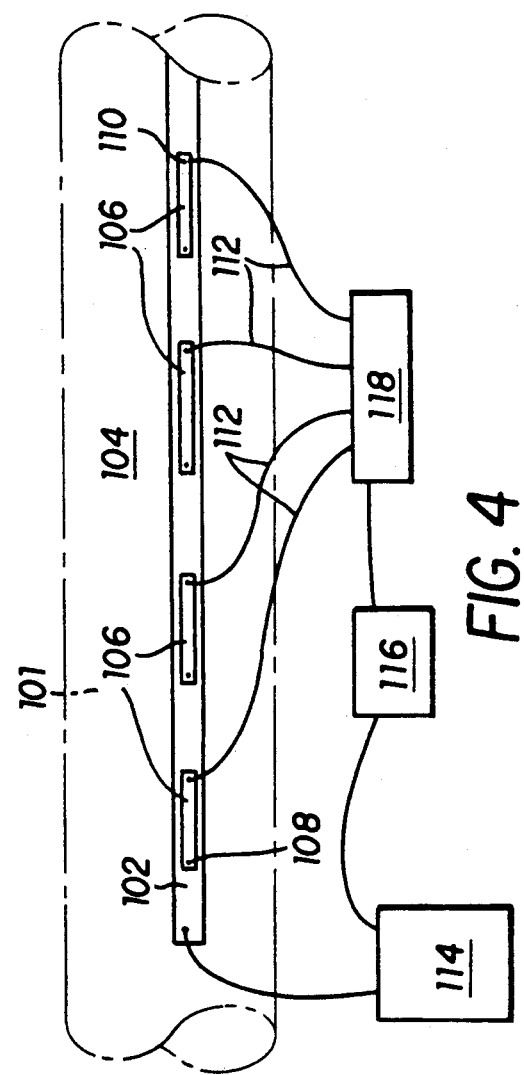

SUPERCONDUCTOR SENSORS

CROSS REFERENCE TO RELATED APPLICATIONS

This application is a continuation-in-part of U.S. Ser. No. 07/104,136, filed Oct. 5, 1987, and entitled Manufacture of Superconducting wire and cable. The disclosure of the parent application, Ser. No. 7/104,136, filed Oct. 5, 1989, now abandoned is hereby incorporated by reference.

BACKGROUND OF INVENTION

This invention relates to a sensor for detecting changes in the critical parameters affecting superconductors, and to a method and apparatus therefore.

It is known that superconductors are constrained to operate within specific limits identified as the Critical Current as well as the Critical Temperature and the Critical Magnetic Field. If the strength of the magnetic field surrounding a current-carrying superconductor is allowed to exceed the critical value, the conductor will abruptly lose its superconducting ability and will revert to the normal current-carrying mode for its specific material. If the surrounding temperature is allowed to increase above the critical value, a superconductor similarly may lose its superconducting ability, abruptly.

Because superconductors for power transmission applications may carry extremely high electrical currents (on the order of 10,000 amperes) in routine operation, a sudden loss of superconducting ability can cause serious physical damage to the superconductor itself and surrounding structures, if the overall conductor structure is unable to carry the full current under non-super conducting conditions. The principal design feature of a superconductor is the carrying of high levels of current. Many composite superconductor structures of modern design include some provision for shunting the high operating currents which they carry in normal operation, through an integrally formed non-superconducting structure, when superconductivity is lost temporarily. This "shunting" mode of operation provides desirable protection for the superconductor structure and its associated structures and circuits; however, the preservation of substantially uninterrupted current flow in this manner, may mask or suppress current flow variations which would otherwise provide meaningful warning signals of abnormal or undesirable conditions in the critical parameters.

For these reasons it is desirable to detect changes in the critical parameters of temperature and magnetic field strength in the immediate environment of a superconductor, as soon as possible, and to anticipate changes in these parameters which may lead to the loss of superconductivity.

Accordingly, it is an object of this invention to provide a sensor capable of functioning in the normal operating environment of a superconductor cable.

It is a further object of this invention to provide a sensor conductor structure embodying superconductive material which is particularly adapted for use in close proximity to a current-carrying superconductor to detect changes in the ambient critical parameters.

Still another object of this invention is to provide an assembly having means for generating signals indicative of changes in the critical parameters in the immediate environment of a superconductor.

And, still another object of this invention is to provide an assembly of the type described which is capable of providing signals indicative of changes in the temperature and the magnetic field surrounding a superconductor before the superconductor responds adversely to such changes.

And further objects of this invention include the techniques for the production of the wire that is to be used as the superconducting sensor conductor.

BRIEF SUMMARY OF THE INVENTION

The invention herein permits the manufacture of superconducting wire of small diameter fine wire sizes having adequate flexibility, ductility and malleability, and which avoid the hitherto encountered problems of brittleness, friability, unwanted atmospheric exposure and the like, thereby rendering the formation of small diameter superconducting wire practical for increasingly demanded use. The wire of the invention may be handled largely as conventional wire prior to installation and usual supercooling thereof in a working environment. In further applications, these fine wires of superconducting material are uniquely suited to use as superconducting sensors for the detection of changes in either the critical magnetic field surrounding or the critical temperature of a current-carrying superconductor.

To this end the invention embraces utilizing techniques heretofore only employed in the manufacture of sheathed resistance heating or thermocouple conductor elements. By uniquely adapting the same to superconductor manufacture, the highly desirable and sought results of the invention are attained.

The sensor conductor structure of this invention is characterized by a core of superconductive material, a surrounding body of insulating material and an outer sheath of malleable material surrounding the insulating body, to provide structural strength and integrity. The superconductive material is characterized by a critical temperature and a critical magnetic field which cause it to alter its superconducting state in response to changes in its ambient temperature and magnetic field before such changes significantly affect a current-carrying superconductor with which it is assembled for use.

A sensing assembly in accordance with this invention comprises a relatively small and lightweight superconductive sensor conductor, whose primary purpose and design is not to carry high current loads, with little or no shunting ability, positioned in close proximity to a high current-carrying superconductor; an electrical current source connected to establish relatively low energy electrical current flow between the ends of the sensor conductor in a known manner (or a voltage meter could be substituted therefore); and, an indicating device for monitoring the flow of electrical current through said sensor conductor to detect changes therein which are indicative of changes in the critical parameters of the environment surrounding the assembly.

These, and other and further objects, features and advantages of this invention will be made apparent to those skilled in this art, by reference to the following description and the accompanying drawings.

DESCRIPTION OF THE DRAWINGS

FIG. 3 is a schematic representation of a sensor cable assembly embodying a current-carrying superconductor and associated sensing circuitry in accordance with this invention.

FIG. 4 is a schematic representation of another embodiment of this invention using multiple independent superconductive sensors, positioned along the length of a current-carrying superconductor, in association with a thin film bus conductor formed on the outer sheath of the current-carrying conductor.

DETAILED DESCRIPTION OF THE INVENTION

Figure 1:
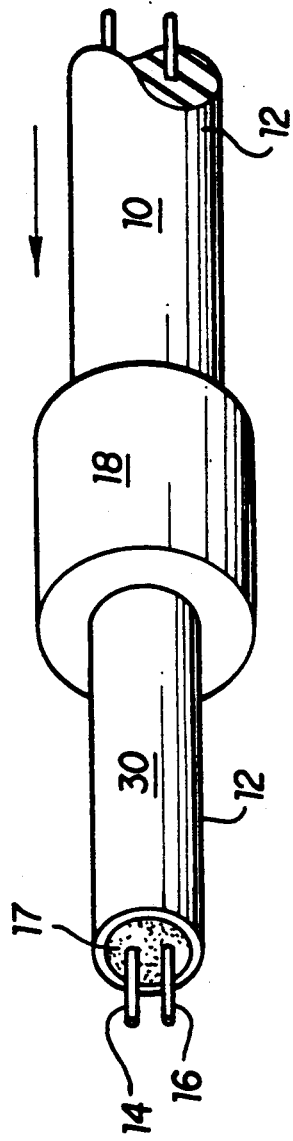
FIG. 1 is a partial, pictorial representation of a conventional superconductive thermocouple cable, partially sectioned, in the process of fabrication using a forming die in accordance with the prior art.

Referring now more specifically to the drawings, FIG. 1 may be seen to represent a conventional length of sheathed and insulated thermocouple cable 10, comprising a pair of spaced-apart wire leads 14, 16, maintained in spaced-apart relationship by and within a body of compacted insulating material, contained within an outer sheath member 12. The leads 14, 16, for thermocouple applications, are formed of dissimilar metals such as Alumel and Chromel, while the insulating body may be formed of any suitable compactible conventional material such as granular magnesium oxide or aluminum oxide. The outer sheath 12, typically is formed of a malleable metal such as copper, which is initially of a larger diameter than that of the finished cable, to facilitate insertion and positioning of the leads 14, 16, and filling and compacting of the insulating material. In the conventional manufacture of such cables, the initial larger diameter of the sheath is reduced, after insertion of the leads 14, 16 and the insulating material, by drawing the composite assembly through one or more "reducing" or "drawing" die means, such as is shown illustratively as 18 in FIG. 1. The output of the die means 18 is a finished cable or conductor 30, of predetermined and desired diameter, as shown in FIG. 1.

With some variations which will be readily apparent to those skilled in the art, the prior art cable forming techniques described in the foregoing paragraph, have been applied to the manufacture of cables or conductors for electrical heater elements for ovens and hot water heaters, wherein the inserted wire lead is a resistance element maintained in spaced relation to itself and to the outer sheath by a body of compacted insulating filler material.

Figure 2:
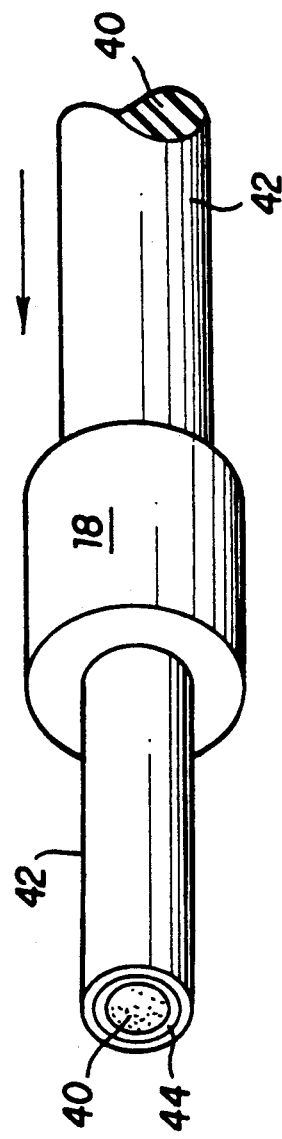
FIG 2 is a partial, pictorial representation of a sensor cable in accordance with this invention, partially sectioned, in the process of formation in a forming die.

In the present invention, these manufacturing techniques have been applied to the fabrication of a sensor cable for detecting changes in the temperature and magnetic field surrounding a superconductor. As shown in FIG. 2, such a sensor cable comprises a suitable core 40 of superconductive material which may be initially of rod or particulate form. The core 40 may be surrounded by and supported within a body of compressible insulating material 44 which may be any known appropriate material such as silver, magnesium oxide, aluminum oxide, or the like. In the case of superconductor sensor construction 44 can be either an electrical conductor or an electrical insulator, In the case of heater or thermocouple construction 44 must be an electrical insulator.

The invention herein adapts this technique to the fabrication or superconductors, wherein, illustratively, as seen in FIG. 2, appropriate particulate, nonparticulate, crystalline or fibrous superconductive material, having flexible or brittle characteristics, 40, is received within an external sheath of metal 42. The superconductive material, with or without a compressible insulating layer 44, may be readily filled into any length of tubing 42 of larger diameter, as for example, a relatively large one-inch diameter tube, and thereafter drawn through die means as at 18, to reduce the diameter of and substantially elongate the sheathed or clad superconductor. Appropriate annealing steps may be associated with the drawing and reducing in known manner and to facilitate die passage of the sheath metal.

An outer sheath member 42 formed of copper or other suitable malleable metal, such as stainless steel, contains the core and the insulation, and provides structural integrity and physical support for the composite sensor cable. A sensor cable fabricated in this manner may be drawn down through a drawing die or dies such as 18 as shown in FIG. 2, and as previously mentioned, to any appropriate and desired small, fine wire size. Such a superconductive sensor cable will respond promptly and sensitively to changes in ambient temperature and magnetic field strength conditions.

In the further application of this technique to form superconductive wire for use as sensors, the superconductive material in rod or particulate form is surrounded by an insulating layer. Suitable materials for the insulating layer would include silver, magnesium oxide, aluminum oxide (compressible materials); Teflon, Peak (noncompressible materials); or like materials. An outer surrounding layer of material, copper or other malleable materials, is used to contain the core and insulating layer. The insulating layer not only protects the superconductive material from the effects of water vapor and oxygen and atmospheric contamination but it also keeps the superconductor from being contaminated by the outer protective/supporting layer during the reduction and any necessary heating/annealing/sintering processes. When a compressible insulating layer is used the sensor can be assembled, as a superconductive material core with compressible insulation surrounded by a sheath, and then subjected to reduction in diameter by passing it through a succession of reducing dies. When a noncompressible insulating layer is used the sensor can be assembled first by reducing the superconductive material core diameter by passing it through a series of reducing dies. The superconductive core wire is then coated with the noncompressible insulating layer and placed in a sheath which is then subjected to a reduction in diameter by passing it through a die to "snug" the sheath to the superconductive core wire coated with the insulation layer. In either case where the superconductive core wire maintains its own integrity and exhibits flexible properties encasement in an outer sheath may not be required for its use as a sensor.

For example, suitable sensor cables may be fabricated in accordance with the following examples and comments:

EXAMPLE 1

1 foot of a Cu/Nb47%Ti superconducting material with a 0.236 inch outside diameter is drawn down through a series of 45 dies with a 15% reduction in each to a finished size of 0.0063 inches. This wire is run through a plasticextrusion machine and a 3 mil coating of Teflon is deposited on the wire. 200 feet of this wire is looped to form a 100 foot length. This looped wire is then placed inside of a copper tube having an outside diameter of 0.050 inches and a wall thickness of 0.0035 inches with a length of about 80 feet. The combined loop and copper sheath is drawn down to a diameter of 0.04 inches in two draws, first die of 0.043 and second die of 0.040 inches, with a final length of 100 feet. The copper sheath was welded closed at the loop end of the Teflon coated superconductor.

EXAMPLE 2

A 1 foot length of silver tube having an outside diameter of 0.187 inches with a wall thickness of 0.020 having one end welded closed is filled with particulate (2 to 5 microns) $YBa_2Cu_3O_{7-x}$ (123). The open end of the tube is crimped closed and the tube is then placed in a 1 foot length of copper tubing with an outside diameter of 0.250 inches and an inside diameter of 0.190 inches with one end welded closed. The silver tube is inserted welded end first. The copper tube is then pinched closed. The composite tubes are then drawn to an outside diameter of 0.006 inches using 46 dies producing a 15% reduction in each die pass. A 200 foot section of the composite copper and silver tube with the particulate $YBa_2Cu_3O_{7-x}$ is looped to form a 100 foot section and it is threaded onto 2-hole 2 inch long magnesium oxide pellets with an outside diameter of 0.032 inches having 0.008 holes. The 100 foot beaded string is inserted into a copper tube with an outside diameter of 0.0415 inches and an inside diameter of 0.034 inches. A 6 inch length of solid, 0.032 outside diameter, magnesium oxide pellets is inserted against the looped end of the assembly. The tube is now pointed to reduce the end for a short distance to fit into a 0.035 inch drawing die. The assembly is now drawn to the 0.035 inch outside diameter. The assembly is trimmed back from the loop end to within $\frac{1}{2}$ inch from the loop and then the tube is welded closed. The opposite end is stripped leaving the 2 conductor ends extending at least 3 inches beyond the tube end for electrical connections. The assembly is now pulled through an annealing oven at 950 degrees Fahrenheit, just below the melting point of the silver tube (960° F.) to sinter the $YBa_2Cu_3O_{7-x}$ powder.

The reduction may be on the order of from 400 to as much as 10,000 times, thereby to produce a wire-like superconductor of 0.010" diameter. Obviously, other small diameter sizes may be achieved. In so doing, however, greatly enhanced facility of manufacture is achieved by employment of the filling and reducing steps, and equally importantly, the now-encased superconductor material is shielded from ambient atmosphere prior to and in use, thereby precluding degradation of the material or attack thereon.

In like manner, the ductile metallic sheath, which is quite thin in thickness, permits ready chilling and supercooling of the superconductive material in its use.

It will be seen that with drawing die reductions of up to 10,000 times, vast lengths of superconductive wire are obtained, and wherein further, the actual thickness thereof does not have the inherent criticallity of electric heating elements or resistors, for example, by virtue of the superconductive and substantially resistance-free characteristics thereof for the purposes contemplated herein.

The particular superconductive materials to be encased and elongated are not critical to the inventive concept, other than being adaptable to the sheath-filling and compaction-elongation or thin film/deposition techniques contemplated. Thus, for example, the superconductive materials that can be handled by this invention would include those that operate at low temperatures such as that of liquid helium (4.2K) to high temperatures equal to or above that of liquid nitrogen (90K). Such materials include niobium-tin and niobium-titanium compounds (4.2K) in filimentary or other form, $Nb_3Ge$ (23K), sintered oxides of La-Ba-Cu-O (30K), perovskites (35K), $A_1BCu_3O_7$ and $(A_xB_{1-x})CO_4$ where A represents elements from rare earth metals or yttrium and B represents alkaline earth elements such as Ca, Sr and Ba, $YBa_2Cu_3O_x$ with x being close to 7 (91K), $K_2N_1F_4$ and ceramic compounds with bismuth and thallium (125K).

When an appropriately fine and responsive sensor cable is assembled in close proximity to a current-carrying superconductor cable, with electrical circuitry and signal means of the type herein described and shown diagrammatically in FIG. 3, the sensor cable will readily react to changes in the ambient temperature and magnetic field conditions surrounding the current-carrying superconductor and will provide indications of such changes, in the following manner:

With reference to FIG. 3, a sensor cable 51, having a critical temperature and critical magnetic field equal to or lower than that of the current-carrying superconductor cable with which it is assembled, is assembled in close, parallel and substantially coextensive proximity with a current-carrying superconductor cable 55. The sensor 51 may be a single conductor cable positioned to form a substantially continuous loop extending from a first location 61 on the superconductor 55 to a remote second location 63, and then returning to the first location 61, so that the terminals 62, 64 at the opposite ends of the sensor 51, are both available for access to electrical connections at the first location. An electrical sensor/detector assembly in accordance with this invention includes power supply means 60 for establishing an electrical current flow of known value in a sensor cable 51 which is operating in superconducting mode; as a result of this arrangement, changes in the electrical resistance of the superconducting sensor caused by variations in the temperature or magnetic field strength of the environment immediately surrounding the sensor and the current-carrying superconductor cable with which it is assembled, will cause the known current flow in the sensor to vary from its predetermined value, and this will provide an indication that changes have occurred in the ambient environment. The current flow, and changes therein may be monitored by any suitable measuring/detecting device 65 of appropriate sensitivity such as a digital ammeter of known design. Similarly, the power supply 60 which provides the known current flow, may be any commercially available controlled current power supply of known design. Essentially the sensor cable 51 will either allow a current flow because it is operating at its superconductive critical temperature or magnetic field or there will be no current flow because the superconductor cable will completely resist the flow of current outside the critical temperature and magnetic field. As a variation thereon, the terminal ends 62 and 64 of the sensor cable 51 may be located at different points along the current-carrying superconductor 55.

In FIG. 4, a current-carrying superconductor 101 is shown to have a thin film of ordinary conductive material 102 defining a conductive bus strip along the outer sheath 104. The bus 102 may be formed readily by well known deposit or film forming techniques such as are widely used in the printed circuit art. Positioned on the surface of bus 102 at intervals along its length, are strips of superconductive material 106, which may be formed and deposited by similar techniques. Each strip is electrically coupled to the bus 102 at a given location such as 108, and a plurality of ordinary conductor leads wires 112 are coupled to the strips 106 at a separate location 110 on each strip. A power supply 114 is coupled to establish an electrical current flow through the strips by means of the bus 102 and the leads 112. Specifically, one terminal of the power supply 114 is coupled to the bus, and the other terminal is coupled in sequence, to the leads 112, through a detector device 116, and a sequence switch 118. As described previously herein, the detector means 116 will indicate changes in the flow of current through each superconductive strip 106, depending upon the position of switch 118. Under normal ambient conditions for such an assembly, the resistance of the strips 106 will be very low and the predetermined current flow will remain unchanged. When the ambient temperature or magnetic field exceeds the critical values for strips 118, one or more will lose its superconducting capacity, increasing its resistance, approaching "infinity", and indicating the location of an abnormality by means of a signal from current flow detector 116, and the position of switch 118. Both switch 118, and detector 116 may be any suitable commercially available device of which various forms exist.

Although a particular embodiment of this invention has thus far been described herein, it will be readily apparent to those skilled in this art, that many other and different embodiments are possible within the scope of this invention, in light of this disclosure, such as, for example, an assembly in which a single conductor sensor extends from a first location on the current-carrying superconductor and terminates at a second, more remote location, and the predetermined known current is made to flow through the sensor from the first location to a ground connection at the termination of the sensor cable at the remote location.

In yet another embodiment of a sensor assembly, the sensor cable may comprise a pair of like conductors electrically insulated from each other but contained within a common outer sheath in the manner of the dissimilar thermocouple wires shown in the prior art illustration of FIG. 1.; such a sensor would extend along a current-carrying superconductor from a first location in the manner already fully described herein, and the like conductors would be electrically joined to each other at one end of the sensor, such that a continuous electrical path would extend through the pair of conductors by travelling through one of the conductors in one direction along the superconductor and returning through the other conductor in the other direction in the manner of the continuous loop previously described herein in connection with FIG. 3. Electrical connections to a looped sensor formed in this manner would not differ substantially from the connections and circuitry fully illustrated and described with reference to FIG. 3.

In yet still another embodiment of a sensor assembly, the sensor cable may comprise a strip of flexible insulating material upon which is deposited, using printed circuitry technology, a main current carrying conductor along the length of the strip; discrete deposits of a superconductive material, with critical temperature and magnetic field equal to or lower than that of the current-carrying conductor to which the sensor will be affixed, spaced along the length of the strip; and individual conductor leads connecting each deposit of superconductive material both to the main current-carrying conductor and to a detector device and a sequence switch.

It should be understood that more than one sensor may be used in assembly with a single current-carrying superconductor within the scope of this invention; the different sensors may be made to extend along different portions of the length of such a superconductor so that each sensor will provide separate indications of conditions along separate portions of the length. Further, the multiple sensors may extend for different lengths from a substantially common starting point, in overlapping relationship, so that the approximate axial location of a change in the ambient conditions along the superconductor cable can be determined by noting which of the overlapping sensors indicate changed conditions, and which do not. A single monitoring/indicator device may be used in shared relation with the multiple sensors by momentarily coupling it to each one in predetermined sequence by means of mechanical or electronic sequential switching means of any known and commercially available design.

While we have described preferred forms of our invention, the same may embrace variants and modification thereof within the scope thereof as defined within the appended claims.

What is claimed is:

1. An assembly for detecting changes in the ambient magnetic field conditions and the ambient temperature conditions surrounding a current-carrying superconductor, which conditions are associated with the operation of said current-carrying superconductor, said current-carrying superconductor being characterized by a critical temperature of given value and a critical magnetic field of a given value, said assembly comprising:

a sensor conductor positioned in proximate, substantially parallel relationship with said current-carrying superconductor along the length of said superconductor over which changes in said ambient magnetic field conditions and temperature conditions are to be detected;

said sensor conductor comprising a core of superconductive material and an outer layer of malleable material surrounding said core, and having a critical temperature and a critical magnetic field not greater than the given values of the critical temperature and the critical magnetic field of said current-carrying superconductor, such that the electrical conductivity characteristics of said sensor conductor change in response to changes in ambient external magnetic fields and changes in ambient external temperature associated with said current-carrying superconductor;

a means for creating a potential different between spaced-apart points on said sensor conductor; and electrical circuit measuring means coupled to said sensor conductor for sensing changes in the electrical current flow through said sensor conductor independently of current flow through said current-carrying superconductor, said changes in current flow being indicative of changes in the electrical conductivity characteristics of said sensor conductor induced by changes in the ambient magnetic field conditions and ambient temperature conditions associated with the proximate current-carrying superconductor.

2. The assembly of claim 1 wherein the sensor conductor comprising said central core of superconductive material and said malleable outer layer is formed by drawing said sensor conductor through a die to reduce the diameter thereof and to compact the material therein.

3. The assembly of claim 1 wherein the sensor conductor comprising said central core of superconductive material and said malleable outer layer is formed by drawing said sensor conductor through a series of dies to reduce the diameter thereof between 400 and 10,000 times to compact the material therein.

4. The assembly of claim 1 wherein the malleable material of said sensor conductor is selected from the group comprising copper, lead, silver, gold, aluminum and stainless steel.

5. The assembly of claim 1 wherein the superconducting core material of said sensor conductor is selected from the group comprising and niobium tin, niobium titanium and $YBa_2Cu_3O_{7-x}$.

6. The assembly of claim 1 wherein said sensor conductor is imbedded in said current-carrying superconductor.

7. The assembly of claim 1 wherein the sensor comprises a strip of flexible insulating material on which is printed a first current carrying conductor connected to the power source and second current carrying conductors connected at one end to the first conductor wherein the second conductors are then separately connected to deposits of superconductive material spaced along said strip and connected to a detector means at their other end.

8. The assembly of claim 1 wherein said sensor conductor further comprises an intermediate layer of an insulating material substantially concentric with and surrounding said core of superconductive material, within said outer layer.

9. The assembly of claim 8 wherein the sensor conductor comprising said central core of superconductive material, said intermediate layer of compressible insulating material and said malleable outer layer is formed by drawing said sensor conductor through a die to reduce the diameter thereof and to compact the material therein.

10. The assembly of claim 8 wherein the sensor conductor comprising said central core of superconductive material is reduced in diameter by passing it through a series of dies and then said reduce core is coated with an intermediate layer of noncompressible insulating material and finally said coated reduced core is placed in said malleable outer layer and the composite sensor conductor is formed by drawing said sensor conductor through a die to just reduce the diameter of the malleable outer layer thereof and to contact the material therein.

11. The assembly of claim 8 wherein the insulating material of said sensor conductor is non-conducting.

12. The assembly of claim 8 wherein the non-conducting noncompressible insulating material of said sensor conductor is selected from the group comprising Teflon and Peak.

13. The assembly of claim 8 wherein the core material of said sensor conductor is NbTi and the material of the intermediate noncompressible insulating layer is Teflon and the malleable outer layer material is copper, for sensing ambient external low temperature conditions.

14. The assembly of claim 8 wherein the core material of said sensor conductor is particulate $YBa_2Cu_3O_{7-x}$, and the material of the intermediate compressible insulating layer is silver, and the malleable outer layer material is copper, for sensing ambient external high temperature conditions.

15. The method of detecting changes in the ambient magnetic field and temperature conditions surrounding a current-carrying superconductor of the type characterized by a critical temperature of a given value and a critical magnetic field of a given value, comprising the steps of:

placing a sensor conductor of the type having a critical temperature and a critical magnetic field of values not greater than the given values of the corresponding parameters of said current-carrying superconductor, in substantially parallel proximate relationship to said current-carrying superconductor;

creating an electrical potential difference between spaced-apart points on said sensor superconductor;

monitoring changes in electrical current flow in the sensor superconductor independently of current flow through the current-carrying superconductor to detect changes in the electrical resistance thereof which reflect changes in ambient magnetic field and temperature conditions surrounding said current-carrying superconductor and said sensor superconductor in advance of any resulting changes in the current-carrying capacity of said current-carrying superconductor.

16. The method of claim 15 wherein said sensor superconductor is imbedded in said current-carrying superconductor.

* * * * *